United States Patent
Mehringer

(10) Patent No.: US 9,991,816 B2
(45) Date of Patent: Jun. 5, 2018

(54) METHOD FOR OPERATING AN AT LEAST GENERATOR-OPERABLE ELECTRIC MOTOR AND MEANS FOR THE IMPLEMENTATION THEREOF

(71) Applicant: SEG AUTOMOTIVE GERMANY GMBH, Stuttgart (DE)

(72) Inventor: Paul Mehringer, Stuttgart (DE)

(73) Assignee: SEG Automotive Germany GmbH, Stuttgart (DE)

( * ) Notice: Subject to any disclaimer, the term of this patent is extended or adjusted under 35 U.S.C. 154(b) by 0 days. days.

(21) Appl. No.: 15/325,854

(22) PCT Filed: Jul. 17, 2015

(86) PCT No.: PCT/EP2015/066396
§ 371 (c)(1),
(2) Date: Jan. 12, 2017

(87) PCT Pub. No.: WO2016/012360
PCT Pub. Date: Jan. 28, 2016

(65) Prior Publication Data
US 2017/0163168 A1 Jun. 8, 2017

(30) Foreign Application Priority Data

Jul. 25, 2014 (DE) .................. 10 2014 214 720
May 5, 2015 (DE) .................. 10 2015 208 302

(51) Int. Cl.
*H02M 7/00* (2006.01)
*H02M 3/00* (2006.01)
(Continued)

(52) U.S. Cl.
CPC .......... *H02M 7/003* (2013.01); *H01L 25/115* (2013.01); *H02K 11/046* (2013.01); *H02M 3/00* (2013.01)

(58) Field of Classification Search
CPC .................................................. H02M 7/003
(Continued)

(56) References Cited

U.S. PATENT DOCUMENTS 7,221,127 B2 * 5/2007 Masson ................. H02J 7/1461
322/100

FOREIGN PATENT DOCUMENTS

DE 4038301 A1 6/1991
DE 102006003254 A1 7/2007
(Continued)

OTHER PUBLICATIONS

International Search Report dated Mar. 10, 2016, of the corresponding International Application PCT/EP2015/066396 filed Jul. 17, 2015.

*Primary Examiner* — David S Luo
(74) *Attorney, Agent, or Firm* — Norton Rose Fulbright US LLP; Gerard Messina

(57) ABSTRACT

A method for controlling a multi-phase electric machine, operable at least in generator mode, whose phase terminals in an active bridge rectifier are respectively connected, via addressable first current valves capable of being switched on and shut off, to a first DC voltage terminal and via second current valves to a second DC voltage terminal. The method includes: in a generator mode of the electric machine after occurrence of a load dump, repeatedly initiating and discontinuing phase short circuits of the phase terminals via the first current valves. A magnitude characterizing a natural frequency of the electric machine is ascertained, and the first current valves are addressed with a switching frequency in order to initiate and discontinue the phase short circuits on the basis of the magnitude characterizing the natural frequency of the electric machine.

16 Claims, 7 Drawing Sheets

(51) Int. Cl.
*H02K 11/04* (2016.01)
*H01L 25/11* (2006.01)

(58) Field of Classification Search
USPC .................................................. 318/434, 34
See application file for complete search history.

(56) References Cited

FOREIGN PATENT DOCUMENTS

| | | |
|---|---|---|
| DE | 102009046955 A1 | 5/2011 |
| DE | 102011051447 A1 | 1/2012 |
| DE | 102011051642 A1 | 3/2012 |
| DE | 102010062334 A1 | 6/2012 |
| EP | 2706657 A1 | 3/2014 |
| JP | 2009118637 A | 5/2009 |
| WO | 2013065512 A1 | 5/2013 |

* cited by examiner

METHOD FOR OPERATING AN AT LEAST GENERATOR-OPERABLE ELECTRIC MOTOR AND MEANS FOR THE IMPLEMENTATION THEREOF

FIELD

The present invention relates to a method for operating an electric machine, operable at least in generator mode and having an active bridge rectifier, and an implementation thereof.

BACKGROUND INFORMATION

Generators of the claw pole type, having passive bridge rectifiers, are conventionally utilized in passenger cars. The output of such generators is adjusted via the excitation field, and that in turn via the excitation current. The output voltage furnished by the generator via the bridge rectifier can be held constant, regardless of network load, rotation speed, and temperature, by regulating the excitation field.

When what is discussed hereinafter is simply a "generator," this can refer to an electric machine operable in both generator mode and motor mode, for example a so-called "starter generator." The present invention is suitable not only for claw pole-type generators but instead for all electric machines operable at least in generator mode. In passenger cars, bridge rectifiers in a six-, eight-, or ten-pulse configuration, corresponding to the three-, four-, or five-phase generators that are usually installed, are usually used. The present invention is also suitable, however, for bridge rectifiers having different numbers of phases.

A load discontinuity in the connected network, for example due to connection or disconnection of a load, results in a load discontinuity at the generator. But because the power delivery of the generator cannot be modified arbitrarily quickly due to the inductance of the excitation field, the generator current initially remains constant, which in the context of a load dump can result in an appreciable increase in the output voltage. Dissipation of the excitation field can take several hundred milliseconds.

As long as a battery is present in the vehicle electrical system, that battery generally can absorb the excess generator output and thus prevent an excessive voltage rise. If a battery is not present, however, the output voltage then rises very quickly and is capable of damaging electrical system components and/or the generator.

In generators having passive bridge rectifiers, this is prevented by using Zener diodes as rectifier diodes. The Zener diodes clamp the output voltage above their breakdown voltage, and are therefore capable of absorbing excess current and converting it into heat. Reliable operation of the generator is thereby ensured.

Controllable current valves capable of being switched on and shut off, in particular MOSFETs, can also be used instead of diodes in bridge rectifiers; corresponding bridge rectifiers are then referred to as "active" bridge rectifiers. An advantage is their lower power loss in the switched-on state, and thus better efficiency especially at part load.

The current valves can be controlled in centralized or decentralized fashion. A "centralized" control system is understood to mean that one common control unit monitors all the alternating current phases and controls all the current valves, and optionally also the excitation field of the generator. A "decentralized" control system is understood to mean that one control unit respectively controls one generator phase, and controls, as a function of the phase voltage, only the current valves associated with the respective phase, i.e. only the current valves of a respective half-bridge of the bridge rectifier. Typically, no communication takes place between individual decentralized control units.

In the context of active bridge rectifiers, one possibility for preventing voltage spikes in the vehicle electrical system in the event of a load dump is to switch on the respective current valves of the upper or the lower rectifier branch (i.e., all the high-side or all the low-side current valves) in all the half-bridges. The result is that the electric machine is internally short-circuited but not the connected network, since the current valves of the respective other rectifier branch are not switched on.

The measures just explained are also referred to hereinafter as a "phase short circuit." According to the terminology used here, a phase short circuit is therefore initiated by switching on (making conductive) all the current valves of the respective rectifier branch, and correspondingly discontinued by shutting off those current valves. The semiconductor valves are switched on in this context by furnishing a corresponding control voltage to their gate terminal (addressing), with the result that the drain-source section of the semiconductor valves becomes conductive or low-impedance. The semiconductor valves are correspondingly shut off by terminating the provision of control voltage, and the drain-source section thus becomes non-conductive or high-impedance. In the absence of a phase short circuit, ordinary rectifier operation prevails.

A phase short circuit can be initiated, for example, when the voltage between the DC voltage terminals of the bridge rectifier (usually referred to as B+ and B−), or between the voltage-carrying DC voltage terminal and ground, exceeds an upper threshold value. The phase short circuit can be discontinued again when that voltage then falls below a lower threshold value. Time-based control can also be used.

If the excitation field is not yet sufficiently dissipated at the point in time at which the phase short circuit is discontinued, the voltage between the DC voltage terminals of the bridge rectifier rises again after the phase short circuit is discontinued, and again exceeds the upper threshold value. Phase short circuits are therefore repeatedly initiated and discontinued until the excitation field is completely or sufficiently dissipated. As mentioned, the excitation field can take several hundred milliseconds to dissipate, while the switching phases of initiation and discontinuation of the phase short circuits are typically only a few milliseconds long. Until the excitation field dissipates there is therefore a back-and-forth switchover between phase short circuits and ordinary rectification over a considerable time span, which is also referred to hereinafter as the "de-excitation" time span. Considerable power losses occur in this context, in particular during the phase short circuits. This can result in appreciable stress on and premature failure of the participating current valves.

It is therefore desirable to reduce the stress on corresponding current valves during the de-excitation time span.

SUMMARY

In light of the above, a method for operating an electric machine, operable at least in generator mode and having an active bridge rectifier, and an implementation thereof, are provided. Example embodiments of the present invention are described herein.

The present invention relates to a method for controlling a multi-phase electric machine, operable at least in generator mode, whose phase terminals in an active bridge rectifier are respectively connected, via addressable first current valves capable of being switched on and shut off, to a first DC voltage terminal and via second current valves to a second DC voltage terminal. An example method in accordance with the present invention includes: in a generator mode of the electric machine after occurrence of a load dump, repeatedly initiating and discontinuing phase short circuits of the phase terminals via the first current valves. As explained, the initiation and discontinuation of the phase short circuits is accomplished by addressing the corresponding addressable current valves capable of being switched on and shut off. A load dump is recognized in particular by evaluating the voltage applied between the DC voltage terminals. A load dump exists if, for example, that voltage is above an upper threshold value.

Provision is made according to the present invention that a magnitude characterizing a natural frequency of the electric machine is ascertained, and the first current valves are addressed with a switching frequency in order to initiate and discontinue the phase short circuits on the basis of the magnitude characterizing the natural frequency of the electric machine. As explained below, this can be accomplished in particular by way of a corresponding adjustment of threshold values, but if applicable also with the additional or exclusive use of time-based control.

The magnitude characterizing the natural frequency of the electric machine can be a calculated natural frequency value, for example a natural frequency value that is derived from an instantaneous rotation speed of the rotor of the electric machine or from its revolution period and the number of pole pairs. It can also, however, be a value ascertained from a current signal or voltage signal, as explained below. The natural frequency of the electric machine is also characterized, however, by the period length of the natural frequency, which can likewise be ascertained from the rotation speed of the rotor of the electric machine, or from its revolution period, and the number of pole pairs. Since the rotation speed of the rotor of the electric machine existing at the point in time at which the method is carried out (together with the number of pole pairs, as explained below) also already characterizes the natural frequency, a correspondingly ascertained rotation speed value or one of the derived magnitudes is already a magnitude characterizing the natural frequency. The natural frequency or its period length can be determined from the ascertained rotation speed of the electric machine at the point in time at which the method is carried out, together with the number of pole pairs.

The present invention provides performing the initiation and discontinuation of the phase short circuits in a manner tuned to or synchronized with the natural frequency of the electric machine. As also explained below, the switching frequency does not need to correspond exactly to the natural frequency in order for the advantages of the method according to the present invention to be achieved. It is sufficient, for example, if the switching frequency lies in a frequency range whose lower limit is an integral multiple of the natural frequency minus a predefined tolerance value, and whose upper limit is equal to the integral multiple of the natural frequency plus the predefined tolerance value. Specific numerical values are explained below. A period length of the switching frequency can furthermore also lie in a time range whose lower limit is an integral multiple of a period length of the natural frequency minus a tolerance value, and whose upper limit is equal to the integral multiple of the period length of the natural frequency plus the tolerance value. Corresponding tolerance values enable simpler and less expensive regulation.

A corresponding method advantageously includes switching on the first current valves on the basis of switch-on conditions in order to initiate the phase short circuits, and are shut off on the basis of shutoff conditions in order to discontinue the phase short circuits, the switch-on and/or shutoff conditions being predefined on the basis of the magnitude characterizing the natural frequency of the electric machine.

The switch-on conditions can encompass at least the fact that an output voltage between the first DC voltage terminal and the second DC voltage terminal has exceeded an upper threshold value, the upper threshold value being adjusted, i.e., increased or decreased, as a function (at least) of the magnitude characterizing the natural frequency of the electric machine.

The shutoff conditions can correspondingly encompass at least the fact that an output voltage between the first DC voltage terminal and the second DC voltage terminal has fallen below a lower threshold value, the lower threshold value being adjusted, i.e. increased or decreased, as a function (at least) of the magnitude characterizing the natural frequency of the electric machine. Tuning by way of the threshold values can be accomplished, for example, on the basis of known machine parameters, as explained below with reference to an example.

Assuming that a capacitance $C_{B+}$ at positive DC voltage terminal B+ of the bridge rectifier being used is discharged during the short circuit phases by a constant current $I_V$, the voltage at capacitor $C_{B+}$ then drops constantly according to equation (1):

$$U_{B+} U_{B+,D} + t \times I_V / C_{B+} \qquad (1).$$

Differentiation yields a value $D_u$:

$$D_u = I_V \times D_t / C_{B+} \qquad (2).$$

The electrical natural frequency $f_E$ of the generator, or its period length $T_E$, is respectively defined by the rotation speed n of a rotor of the electric machine, which is indicated here in 1/s but can also be referred to a different time base, or its reciprocal, i.e. the revolution period, and the number of pole pairs P, as:

$$f_E = n \times P, \text{ or } T_E = (n \times P) = P/T \qquad (3).$$

The intention now is to synchronize the time for the electrical revolution frequency and the time of the decay in the voltage at positive DC voltage terminal B+. Introducing $T_E$ from equation (3) into equation (2), the result is:

$$D_u = I_V \times T_E / C_{B+} \qquad (4).$$

In this case the value $D_u$ corresponds, to a first approximation, to the difference between the voltage at which a short circuit is activated and the voltage at which the short circuit is canceled again. The desired state can therefore be brought about, for example, by varying the voltage value at which the short circuit is canceled, i.e., the lower threshold value.

According to an advantageous embodiment of the invention, the adjustment is therefore accomplished, in addition to the aforementioned dependence on the magnitude characterizing the natural frequency of the electric machine, also as a function of a discharge current of a capacitive element connected to the first and/or second DC voltage terminal, and its capacitance. Further magnitudes can likewise be taken into consideration.

Alternatively, direct time-based control or a mixed method can also be used. This means that the switch-on conditions can encompass at least the fact that a predefined switch-on point in time has been reached, and/or the shutoff conditions can encompass at least the fact that a predefined shutoff point in time has been reached. Corresponding points in time can be predefined in particular on the basis of machine frequencies.

In the context of the present invention, an "addressable current valve capable of being switched on and shut off" is understood as a semiconductor switch that furnishes a low-impedance or conductive connection as long as an addressing voltage is applied to a terminal provided therefor. Such addressable current valves capable of being switched on and shut off are, in particular, semiconductor switches such as MOSFETs and/or IGBTs, which are addressed via their gate terminal and furnish the low-impedance or conductive connection via the drain-source section. Addressable current valves capable only of being switched on, which are not a subject of the present invention, are e.g., thyristors. Diodes are likewise current valves, but are not addressable.

In accordance with the present invention, the length of the time span during which switchover occurs between phase short circuit and ordinary rectification operation is predefined by the dissipation of the excitation field or excitation current of the generator, and can be considerably reduced by impressing or amplifying oscillations in the excitation field or excitation current. Excitation or strengthening of the oscillations is particularly effective if the switching frequency of the switching-on and/or shutoff of the first current valves is at least partly synchronized with that frequency by way of the previously explained addressing of the control valves, as explained later on. The present invention thus utilizes the natural oscillation of the system being used in order to shorten a corresponding time span and thereby decrease stress on the participating current valves. Stress on the current valves is also considerably reduced by the fact that the loss-affected switching operations occur at points in time at which a low phase current is momentarily present.

The measures according to the present invention, which make possible both a significant shortening of a corresponding time span and switching operations at times of low phase currents, thus permit a reduction in the power loss in the participating current valves and ultimately an increase in the robustness of a corresponding system.

Although reference is made herein predominantly to load dumps that result from a load shutoff especially in batteryless operation, the method according to the present invention is also suitable in principle for cases in which corresponding load dumps result from a cable cutoff, for example at the positive DC voltage terminal of the bridge rectifier. In the former case, i.e. load shutoff in batteryless operation, the generator supplies, for a transition time of up to a second, more current that the network can absorb. The result, as mentioned above, is an overvoltage that in particular can damage connected control devices. The network must, however, optionally continue to be powered, since battery power is not possible as a transitional solution in batteryless operation. In the event of a cable cutoff, the generator also continues to supply current but there are no longer any connected loads that might be damaged. If a battery is present, loads can be powered from it on a transitional basis. Without further countermeasures, however, here as well the generator continues to supply current; this can lead to an increase in voltage, for example at the positive DC voltage terminal, and to destruction of the power electronics of the generator.

As also shown in the appended FIG. 4, the length of the time span during which switchover occurs between ordinary rectification and phase short circuits depends on the profile of the excitation current, which to a first approximation follows an exponential decay curve in the context of freewheeling. As is also evident from FIG. 4, the duration of the decay curve, or the time until such a decay curve reaches or sufficiently approximates a zero value, depends principally on the initial value of the corresponding current.

If the excitation winding is assumed, for example, to be a coil having a 2Ω resistance and 400 mH inductance, the current of which is quenched via a diode, it can be shown that with the use of pulsed short circuits, an oscillation can be impressed from the stator onto the rotor, which oscillation appreciably shortens the point in time at which the excitation current reaches the zero value (0 A) for the first time, so that a transition into ordinary rectification can occur earlier. Without oscillations this value is reached for the first time at approx. 400 ms; with a superimposed oscillation, after only approx. 80 ms. The greater the amplitude of the superimposed oscillation, the earlier the time is reached. The amplitude in turn depends on how well a resonance condition is satisfied; this is explained below.

Be it noted that the large power-loss energies in the relevant current valves are caused not by the energy stored in the excitation coil, but instead by the continuous current generation as long as the excitation current has not completely decayed:

In the example explained, at 6 A and 400 mH the energy E normally stored in the excitation coil is, for example, 3 $A^2 \times 400$ mH=3.6 J. The energies occurring in the participating current valves in the context of a load dump, on the other hand, are several times higher. Assuming a generator having a 100 A output current and clamping it to 36 V, the aforesaid 3.6 J is reached after only 1 ms.

As is also evident from FIG. 2 explained below and as discussed therein in detail, during the periods of active rectification a reduction occurs in the theoretical delivered current of the generator, whereas during the phase short circuits an upswing in the phase currents can be observed. The excitation current oscillates at the same frequency and the same phase as the phase currents. This is a forced natural oscillation having a natural frequency $f_E=(n \times P)$ (see equation (3)), where n indicates the generator rotation speed in revolutions per second, and P the number of pole pairs. For a generator rotation speed in revolutions per minute (rpm), the natural frequency would be described as $f_E=(n \times P)/60$.

In order to minimize power loss in the participating current valves, the switching operations must occur at the points in time at which the phase currents are low. The frequency $f_{B+}$, resulting from initiation and discontinuation of the phase short circuits, of the oscillation in the output voltage of the rectifier, i.e. the voltage present between the positive DC voltage terminals of the rectifier, is determined by the capacitance $C_{B+}$ connected to the DC voltage terminals, the discharge current $I_E$ that is withdrawn from the capacitance, and the voltage difference between the stored switching thresholds $U_S$ for initiation and discontinuation of the phase short circuits (referred to in the context of the present invention as the upper and lower threshold value); this can be expressed as $f_{B+}=f(C_{B+}, I_E, U_S)$.

Because the capacitance connected to the DC voltage terminals, and the current that is withdrawn from the capacitance, are not modifiable during operation, it is provided inter alia in the context of the present invention to correspondingly modify the switching thresholds for activation and deactivation of the phase short circuit, i.e., the upper and/or lower threshold value, so that the frequency $f_{B+}$ of the oscillation in the output voltage of the rectifier is adapted to the frequency of the natural oscillation $f_E$; as explained below, the condition that should be satisfied is $f_E = f_{B+}$ or $f_E \approx f_{B+}$ or $xf_E = f_{B+}$ or $xf_E \approx f_{B+}$ (where x indicates, for example, an integer from 1 to 5). Alternatively thereto, it is also possible to use a mixed method in which the duration of the phase short circuits, or their switching frequency, proceeds in time-controlled fashion.

As also shown in FIG. 3 explained below, a strong downswing in the rectified current can be achieved by correctly timed, i.e., substantially phase-synchronous, activation and deactivation of the phase short circuits. It is thereby possible to ensure that the time period during which switchover occurs back and forth between ordinary rectification and phase short circuits can be terminated after only a very short time, for example approximately 4 ms. Such a point in time is reached when all the phase currents add up to a value of zero. At this point in time the generator is already completely de-excited. Because of the algorithm that is conventionally used, however, the phase short circuit is initiated again and the residual magnetism of the generator once again generates, with respect to a counter-voltage of 0 V, phase currents above 0 V.

During active rectifier operation, the underlying rotation speed can be tracked at any time based on the phase voltage curves, and the corresponding desired switching frequency can be calculated. As soon as the presence of a load dump is detected based on the voltage at the positive DC voltage terminal B+, the switching frequency between the rectifier phases is adapted to the desired switching frequency. If it is then recognized during a corresponding load dump mode that the phase currents or the excitation current reach (in total) 0 A at a point in time, further activation of phase short circuits can be dispensed with because the electric machine is sufficiently de-excited as of that point in time.

Advantageously, in the context of the present invention, the magnitude characterizing the natural frequency of the electric machine, with the frequency of which the switching frequency of initiating and discontinuing the phase short circuits is at least partly synchronized, can therefore be measured or can be determined from a rotation speed of the electric machine.

As mentioned, the method according to the present invention proves to be particularly advantageous because there is no need to conform exactly to a resonance condition $f_E = f_{B+}$, since what is involved in the present case is a forced oscillation. As already explained, the advantages of the method according to the present invention are already obtained if a condition $f_E \approx f_{B+}$ or $xf_E = f_{B+}$ or $xf_E \approx f_{B+}$ is satisfied. In other words, the at least partial synchronization according to the present invention can be accomplished in such a way that the natural frequency of the electric machine lies in a frequency range around the switching frequency or a multiple of the switching frequency. The switching frequency (or a multiple) therefore need not be exactly hit by the natural frequency and vice versa, as already mentioned above. A switchover between phase short circuit and active rectification, and back, only at each second, third, fourth, etc. minimum of the natural frequency also makes possible the increase in the natural oscillation which is recognized as advantageous according to the present invention. A "synchronization" in the context of the present invention therefore does not necessarily mean an identity of the two aforementioned frequencies. Synchronization can instead also occur in such a way that the natural frequency is equal to the switching frequency of the phase short circuits, or to an integral multiple thereof, plus or minus an optional tolerance value.

Expressed in yet another manner, provision is advantageously made that, if the natural frequency of the electric machine is equal to $f_E$, the switching frequency of the first current valves is equal to $(f_E \times m) \pm (k \times f_E)$, where m is an integer from 1 to 5 and k is in a range from 0 to 0.4. The value m represents, for values greater than one, the aforementioned integral multiple, and the value k a value defining the optional tolerance value.

A computation unit according to the present invention, e.g., a control device of a motor vehicle, is configured, in particular in terms of programmed execution, to carry out a method according to the present invention.

Implementation of the method in the form of software is also advantageous because this results in particularly low costs, especially if an executing control device is also used for further purposes and is therefore present in any case. Suitable data media for furnishing the computer program are, in particular, diskettes, hard drives, flash memories, EEPROMs, CD-ROMs, DVDs, and many others. Downloading of a program via computer networks (internet, intranet, etc.) is also possible.

Further advantages and embodiments of the present invention are evident from the described herein with reference to the figures.

DETAILED DESCRIPTION OF EXAMPLE EMBODIMENTS

Figure 1:
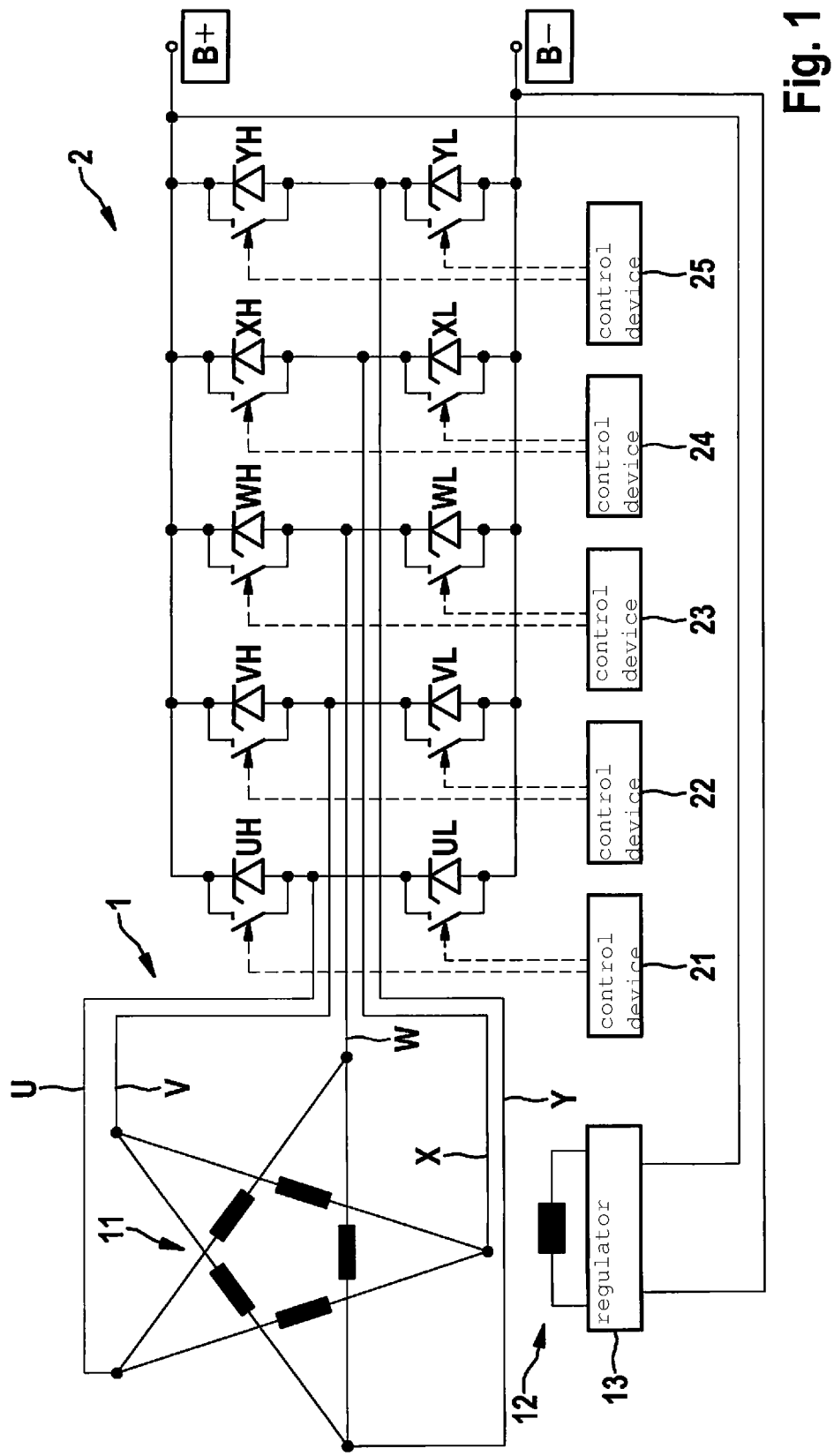
FIG. 1 is a simplified schematic depiction of an assemblage having a generator and an active bridge rectifier.

In the Figures, elements corresponding to one another are labeled with identical reference characters and are not explained repeatedly.

FIG. 1 schematically illustrates an assemblage, having a generator 1 and an active bridge rectifier 2, that can be the basis of an embodiment of the present invention.

Generator 1 encompasses a stator 11 configured with five phases and as a pentagram circuit, and a rotor 12. The individual stator windings of stator 11 and the rotor winding of rotor 12 are depicted with usual circuit symbols but are not labeled separately.

Generator 1 is connected at five phase terminals U to Y, via respective controllable current valves capable of being switched on and shut off (here labeled UL to YL and UH to YH), respectively to a first DC voltage terminal B− and to a second DC voltage terminal B+. The DC voltage terminal B− can typically be connected to ground.

The method according to the present invention will be described below with reference to initiation of a phase short circuit in current valves UL to YL of a "low-side" rectifier branch, but can also be carried out with current valves UH to YH in the "high-side" rectifier branch. The current valves participating in each case are referred to in the context of this Application as "first" current valves; at least these are controllable and capable of being switched on and shut off, and are configured for example as MOSFETs. The controllable current valves UL to YL and UH to YH that are capable of being switched on and shut off are illustrated in simplified fashion in the Figure as switches having Zener diodes connected in parallel. The Zener diodes here symbolize both the typical breakdown property of a MOSFET above a specific drain-source voltage and the reverse diode present in a MOSFET. As is generally usual, current valves UL to YL and UH to YH are disposed in a number of half-bridges corresponding to the number of phase terminals. Current valves UL to YL and UH to YH are respectively controllable by way of decentralized control devices 21 to 25, as illustrated here by dashed addressing arrows.

Current valves UH to YH and/or current valves UL to YL furthermore typically contain a suitable additional circuit, for example to allow voltage clamping to, for example, 30 V.

A generator regulator 13 evaluates a voltage present between DC voltage terminals B+ and B− and regulates the power output of generator 1, for example by pulse width modulated application of current to the excitation winding of rotor 12.

Figure 2:
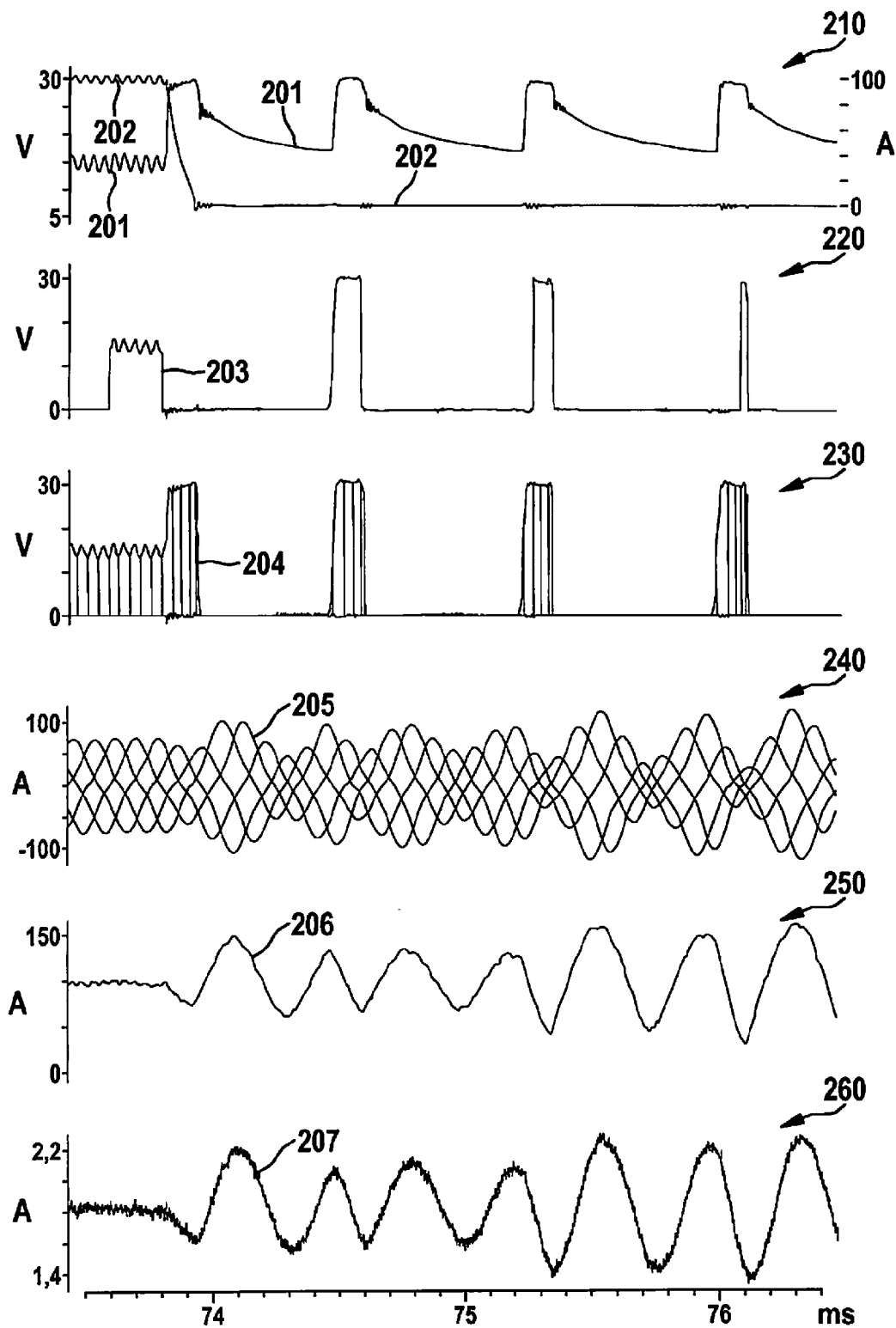
FIG. 2 shows signal curves to explain the principles of a method according to an embodiment of the present invention.

In FIG. 2, current and voltage curves (respectively in A and V) are plotted on the respective ordinates against time (in ms) on the common abscissa. The current and voltage curves depicted in FIG. 2 occur in an assemblage not operated in accordance with the present invention with a five-phase generator having an active bridge rectifier associated therewith, which assemblage can otherwise correspond to the assemblage shown in FIG. 1. The current and voltage curves are illustrated in the form of diagrams 210, 220, 230, 240, 250, and 260.

In diagram 210, a voltage present between the DC voltage terminals of the bridge rectifier is labeled 201. Also illustrated in diagram 210, in the form of curve 202, is a current injected into the network connected to the active bridge rectifier.

In a time period from approx. 73.4 to 73.8 ms the active bridge rectifier is in the regular rectification operating mode. In the example depicted, at a time of 73.8 ms a load dump occurs, for example due to shutoff of a load. The voltage 201 present between the DC voltage terminals of the active bridge rectifier rises rapidly as a result. If the voltage 201 present between the DC voltage terminals of the active bridge rectifier exceeds an upper threshold value (not depicted), the measures repeatedly explained are instituted; for example, the current valves of the low-side rectifier branch are activated.

The corresponding phases of the generator are thereby short-circuited so that the voltage 201 present between the DC voltage terminals of the active bridge rectifier does not rise further. As is evident, the voltage 201 present between the DC voltage terminals of the active bridge rectifier drops again after briefly holding at a plateau, and reaches a minimum at a time of approx. 74.4 ms. When the voltage 201 present between the DC voltage terminals of the active bridge rectifier falls below a lower threshold value (also not depicted), the rectifier transitions back into ordinary rectifier operation.

If the generator is not yet sufficiently de-excited, the voltage 201 present between the DC voltage terminals of the active bridge rectifier rises again and exceeds the upper threshold value, and a phase short circuit occurs again at approx. 74.6 ms in the example depicted. The repeated initiation and discontinuation of the phase short circuit continues until the current has decayed sufficiently.

Diagram 220 of FIG. 2 illustrates the curve, labeled 203, for one of the phase voltages of a corresponding assemblage made up of a generator and an active bridge rectifier. In the example depicted, as mentioned, the generator is configured as a five-phase generator, so that superimposition of the individual phase voltages yields a total curve 204 shown in diagram 230. As is evident, the maximum of phase currents 204 before the load dump event at approx. 73.8 ms is approx. 15 V, due to regulation of the excitation current. After the load dump event at approx. 73.8 ms, a corresponding rise in these phase currents 204 to almost 30 V occurs because of the voltage clamping described in FIG. 1. All the phase voltages drop to 0 V in those time spans in which the generator phases are short-circuited.

Diagram 240 illustrates the phase currents in a corresponding electric machine or active bridge rectifier in the form of curves 205. It is apparent that in particular in the phases of active rectification (visible from the phase voltages 204 illustrated in diagram 230), the envelope of the phase currents 205, and thus also the theoretical delivered current of the generator, is reduced, and an upswing in the phase currents occurs during the short circuit phases.

Diagram 250 illustrates a current, theoretically delivered by an electric machine or an assemblage made up of a corresponding electric machine and an active bridge rectifier, that would be established if the active bridge rectifier were operated continuously in ordinary rectification mode. Diagram 260 illustrates, in the form of curve 207, the excitation current, i.e., a current flowing through a rotor of an electric machine.

Figure 3:
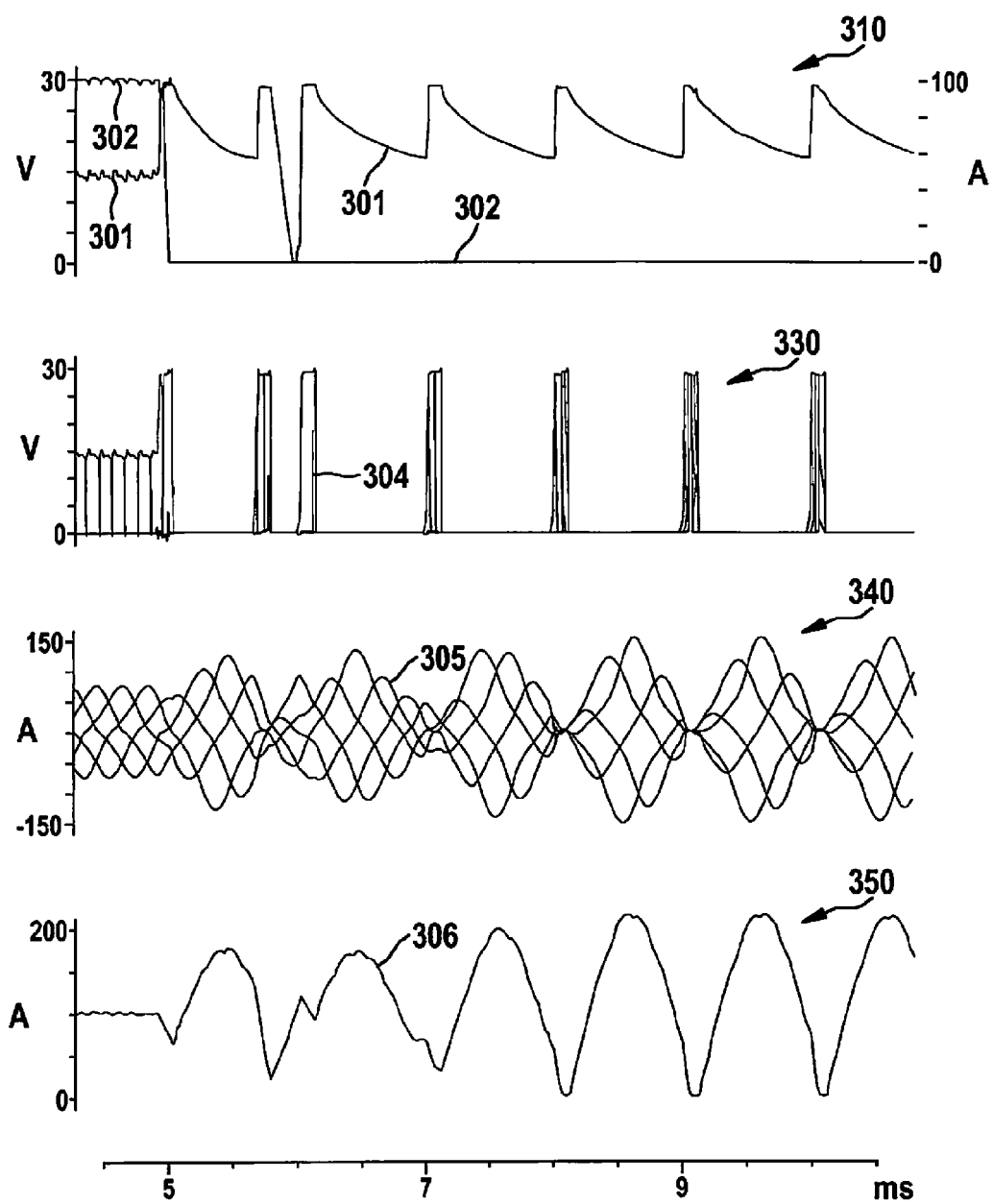
FIG. 3 shows signal curves to explain a method according to an embodiment of the present invention.

FIG. 3 illustrates current and voltage curves that result from addressing of a corresponding assemblage, made up of a generator and an active bridge rectifier, in accordance with a particularly preferred embodiment of the present invention. Diagrams, curves, etc. that correspond to those in FIG. 2 presented previously are labeled with reference characters incremented by 100. Depiction of an individual phase voltage 203 as in diagram 220 of FIG. 2, and of the excitation current curve 207 as in diagram 260 of FIG. 2, has been omitted; the disposition of the remaining diagrams 310, 330, 340, and 350, and the current and voltage curves 301, 302, 304, 305, and 306 shown therein, correspond to those of FIG. 3. The time scale in FIG. 3 differs from that of FIG. 2.

If, as is the case in FIG. 3 starting at approx. 6.0 ms, an initiation and discontinuation of the phase short circuits is performed synchronously with the theoretical delivered current of the generator as illustrated in diagram 350 in the form of curve 306, and thus "in tune" with the natural frequency of the electric machine, what then occurs in the example depicted, already at the time of approximately 9 ms, is that the phase currents, as illustrated in the form of curves 305 in diagram 340, add up to a value of 0 A. The result of a phase-synchronous initiation and discontinuation of the phase short circuits (see especially diagrams 330 and 350 considered together) is that an existing natural oscillation is more strongly excited, and a zero point in the summed phase currents is reached in the excitation current.

As explained above, it is understood that a phase-synchronous initiation and discontinuation of the phase short circuits does not necessarily need to occur. Provision can also be made that the frequency with which the phase short circuits are initiated and discontinued corresponds to a multiple of the frequency of the excitation current, or a merely approximate synchronicity is established.

Figure 7:
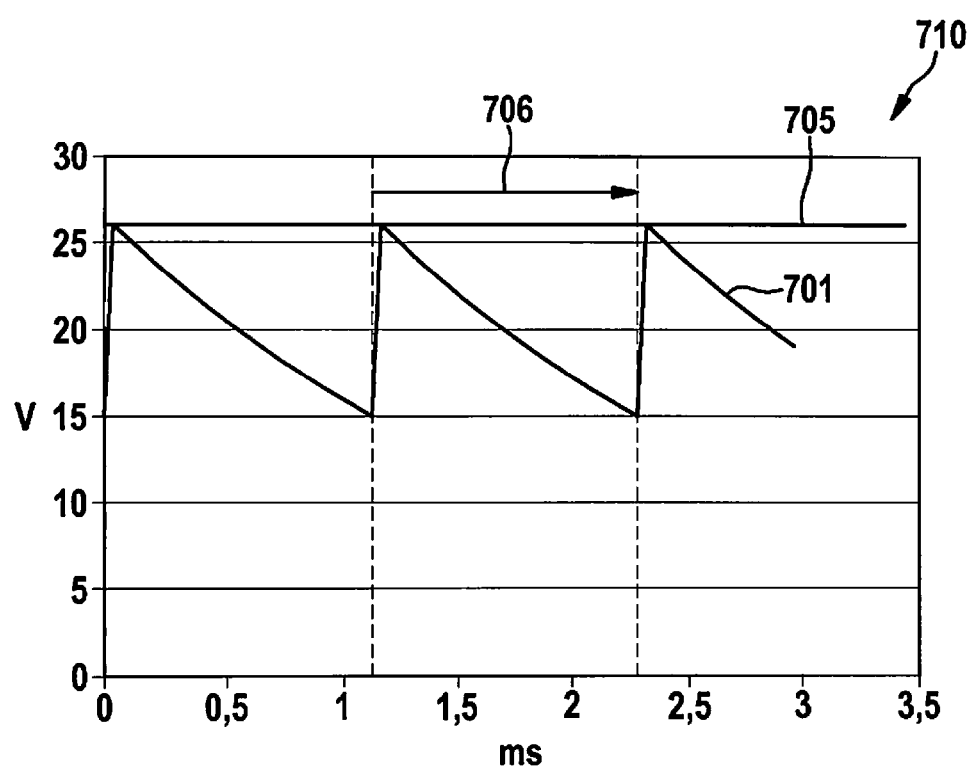
FIG. 7 schematically depicts a signal curve to explain a method according to an embodiment of the present invention.

A voltage curve in accordance with diagram 310 of FIG. 3 is schematically illustrated again in FIG. 7. Reference is therefore already made here to the explanations at the end.

Figure 4:
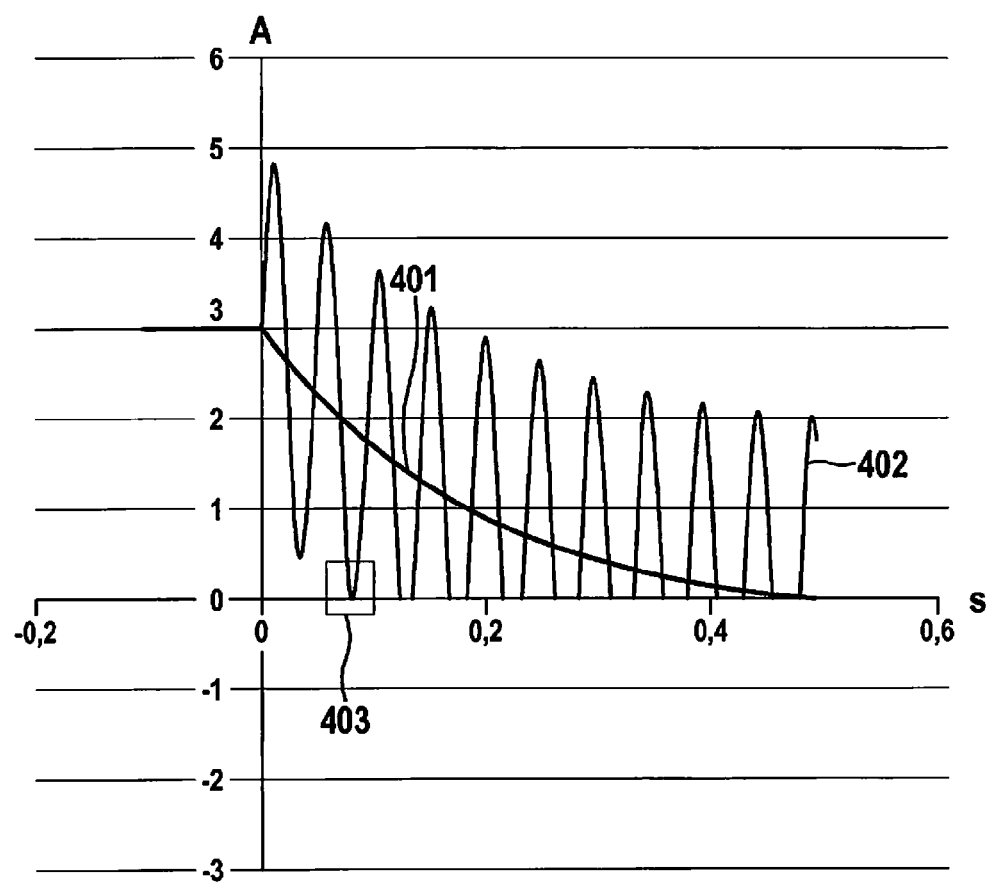
FIG. 4 shows signal curves to explain a method according to an embodiment of the present invention.

FIG. 4 schematically illustrates signal curves to explain a method in accordance with an embodiment of the invention. Here an excitation current 401 having no impressed oscillation and an excitation current 402 having a correspondingly elevated oscillation (in A) are plotted on the ordinate against a time (in s) on the abscissa. The number 403 designates the point in time at which curve 402 first reaches the value of 0 A. This time is appreciably earlier than the point in time (not separately labeled) at which the excitation current 401 reaches the zero value. Further details have already been explained above.

Figure 5:
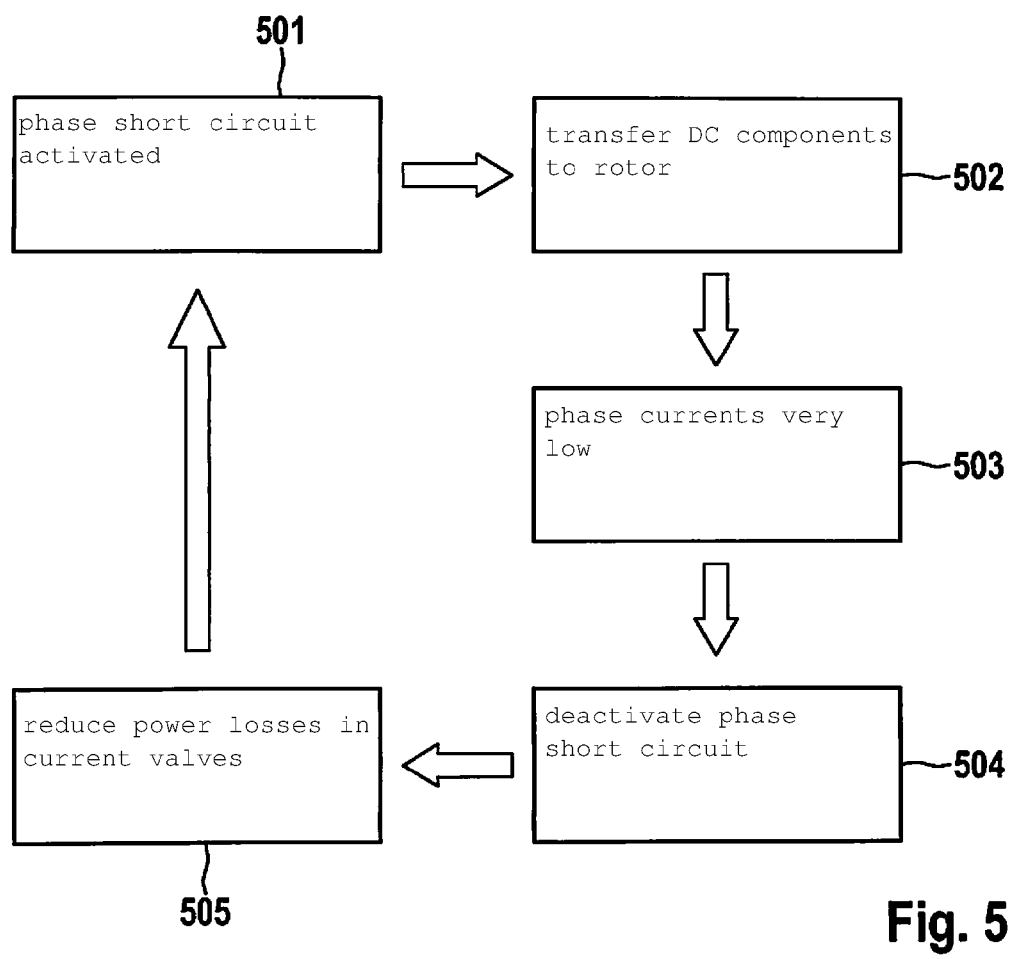
FIG. 5 illustrates, in the form of a diagram, the operating principle of a method according to an embodiment of the present invention.

FIG. 5 illustrates, in the form of a schematic diagram, the operating principle of a method according to an embodiment of the present invention.

As explained, activation of a phase short circuit (block 501) results in a DC component in the phases which is transferred (block 502) in transformer fashion to the rotor of the electric machine (see, for example, rotor 12 in FIG. 1). At a point in time of a low excitation current the phase currents are also very low (block 503), so that a deactivation of the phase short circuit (block 504) should preferably occur at that point in time in order to reduce power losses in the current valves of the active bridge rectifier (block 505). Once a phase short circuit has thereby been discontinued at a favorable point in time, it is then initiated again (block 501) preferably at least partly synchronously with a natural oscillation of the excitation current or of the electric machine, or when a predefined threshold value is exceeded by the output voltage of the rectifier, so that the starting point is reached again.

Figure 6:
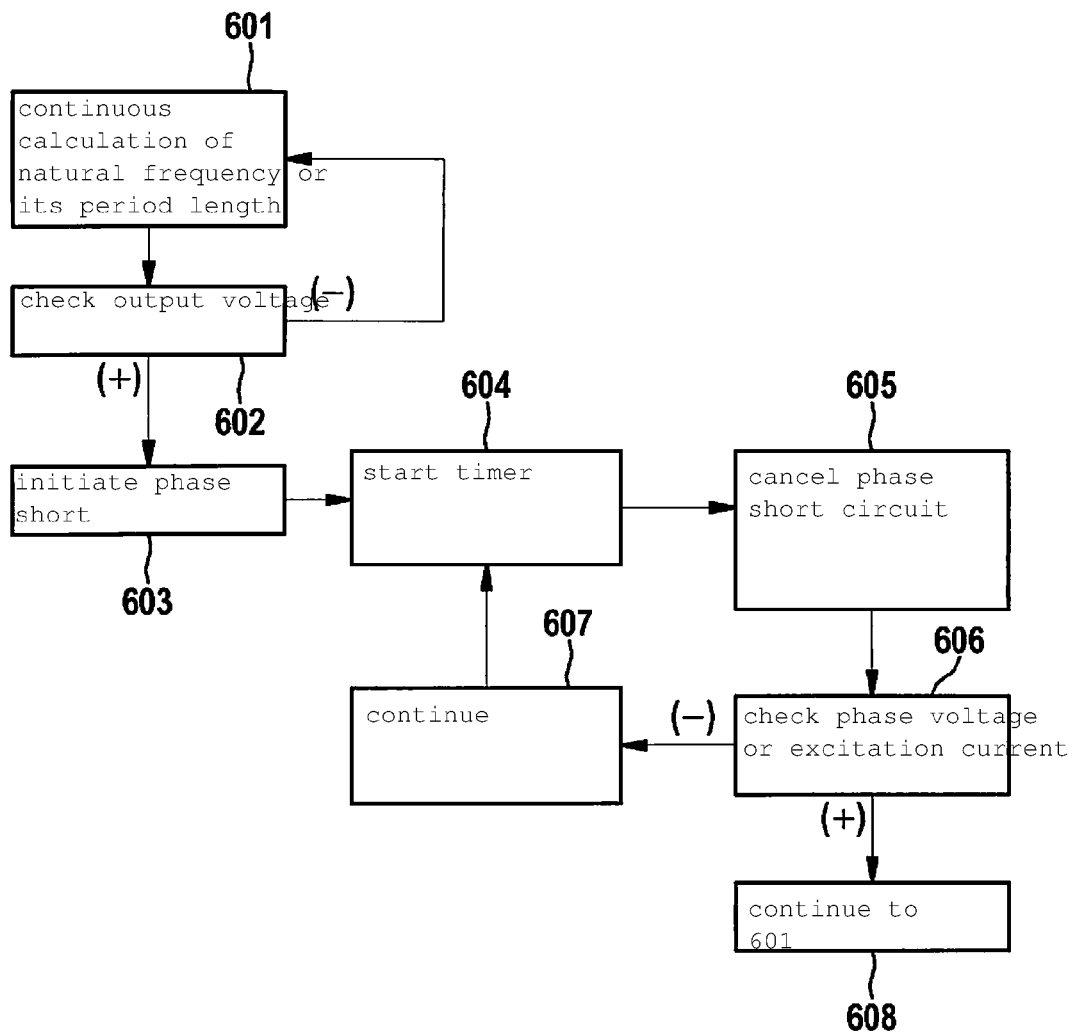
FIG. 6 illustrates, in the form of a diagram, a method according to an embodiment of the present invention.

FIG. 6 illustrates, in the form of a diagram, a method according to an embodiment of the invention.

What occurs in the method, as illustrated by block 601, is a continuous calculation of the natural frequency of the electric machine, or its period length, based on the phase voltage curve which correlates with rotation speed, or for example based on rotation speed and angular position.

As illustrated by block 602, a continuous or periodic check is made as to whether an output voltage between the DC voltage terminals of the active bridge rectifier exceeds an upper threshold value. If No (−), the method is continued cyclically with the steps that are illustrated by blocks 601 and 602 that have been explained. If Yes (+), a phase short circuit is initiated as illustrated by block 603.

As illustrated by block 604, a timer is started and the phase short circuit is cancelled once a period length that was determined in the step according to block 601 (or a multiple, as explained) has elapsed. This is illustrated by block 605. The phase short circuit is also cancelled if the output voltage between the DC voltage terminals of the active bridge rectifier has not yet fallen below a predefined lower threshold.

As illustrated by block 606, a check is now made as to whether the phase voltage or the excitation current (i.e. once again, in general terms, a current flowing through a rotor of the electric machine) has fallen below a predefined minimum value. If No (−), an alternating phase short circuit/DC rectification operating mode is continued; i.e., as illustrated by block 607, a phase short circuit is initiated again when the output voltage between the DC voltage terminals of the active bridge rectifier exceeds the aforementioned upper threshold, timing is restarted according to block 604, and the method continues, as explained, to the checking step illustrated by block 606. If Yes (+), the excitation current or phase current has decayed sufficiently that it is possible to remain in ordinary rectification, i.e. with no further phase short circuits, as illustrated by block 608. The method can then be continued with the step corresponding to block 601.

As mentioned above, a voltage curve in accordance with diagram 310 of FIG. 3 is schematically illustrated again in FIG. 7. The voltage curve labeled 301 in FIG. 7 is labeled 701 in FIG. 7, and here as well a time (in ms) on the abscissa is plotted against a voltage (in V) on the ordinate in a diagram 710. In addition, the upper threshold value of the output voltage of the bridge rectifier is labeled here as 705.

When the output voltage of the bridge rectifier, namely the voltage curve 701, reaches the upper threshold value 705, a phase short circuit is then (as repeatedly explained) initiated. In the example depicted, the phase short circuit is then discontinued once a predefined time has elapsed. The method according to the present invention makes provision to synchronize that time at least partly with the natural frequency of the electric machine or with a corresponding signal, for example the curve for a current flowing through a rotor of the electric machine, so that a time span that is labeled 706 in FIG. 7 corresponds, with possible discrepancies that may be present, to a period length of that current flowing through the rotor of the electric machine (or to a multiple thereof). The natural oscillation is thereby excited.

What is claimed is:

1. A method for controlling a multi-phase electric machine, operable at least in generator mode, whose phase terminals in an active bridge rectifier are respectively connected, via addressable first current valves capable of being switched on and shut off, to a first DC voltage terminal and via second current valves to a second DC voltage terminal, the method comprising:

in a generator mode of the electric machine after occurrence of a load dump, repeatedly initiating and discontinuing phase short circuits of the phase terminals via the first current valves, wherein a magnitude characterizing a natural frequency of the electric machine is ascertained, and the first current valves are addressed with a switching frequency to initiate and discontinue the phase short circuits on the basis of the magnitude characterizing the natural frequency of the electric machine.

2. The method as recited in claim 1, wherein the switching frequency lies in a frequency range whose lower limit is an integral multiple of the natural frequency minus a predefined tolerance value, and whose upper limit is equal to the integral multiple of the natural frequency plus the predefined tolerance value.

3. The method as recited in claim 2, wherein, the natural frequency of the electric machine is equal to $f_E$, and the switching frequency is equal to $(f_E \times m) \pm (k \times f_E)$, where m is the integral multiple having a value from 1 to 5 and k is a value from 0 to 0.4 defining the predefined tolerance value.

4. The method as recited in claim 1, wherein a period length of the switching frequency lies in a time range whose lower limit is an integral multiple of a period length of the natural frequency minus a tolerance value, and whose upper limit is equal to the integral multiple of the period length of the natural frequency plus the tolerance value.

5. The method as recited in claim 1, wherein an ascertained rotation speed of the electric machine at the point in time at which the method is carried out, or a value derived therefrom, is used as the magnitude characterizing the natural frequency of the electric machine.

6. The method as recited in claim 5, wherein at least one of the natural frequency and the period length of the natural frequency, is determined using the rotation speed of the electric machine at the point in time at which the method is carried out and using a number of pole pairs of the electric machine.

7. The method as recited in claim 1, wherein the repeated initiation of the phase short circuits is terminated when current flowing through the rotor of the electric machine, or at least a further current signal of the electric machine, lies for a first time below a threshold value.

8. The method as recited in claim 1, wherein the first current valves are switched on on the basis of switch-on conditions in order to initiate the phase short circuits, and are shut off on the basis of shutoff conditions in order to discontinue the phase short circuits, at least one of the switch-on conditions and the shutoff conditions being predefined on the basis of the magnitude characterizing the natural frequency of the electric machine.

9. The method as recited in claim 8, wherein the switch-on conditions include at least the fact that an output voltage between the first DC voltage terminal and the second DC voltage terminal has exceeded an upper threshold value, a threshold value adjustment of the upper threshold value being performed as a function of the magnitude characterizing the natural frequency of the electric machine.

10. The method as recited in claim 9, wherein the threshold value adjustment is performed as a function of a discharge current of a capacitive element connected to at least one of the first and the second DC voltage terminal, and its capacitance.

11. The method as recited in claim 9, wherein the switch-on conditions include at least the fact that a predefined switch-on point in time has been reached.

12. The method as recited in claim 8, wherein the shutoff conditions include at least the fact that an output voltage between the first DC voltage terminal and the second DC voltage terminal has fallen below a lower threshold value, a threshold value adjustment of the lower threshold value being performed as a function of the magnitude characterizing the natural frequency of the electric machine.

13. The method as recited in claim 12, wherein the shutoff conditions encompass at least the fact that a predefined shutoff point in time has been reached.

14. The method as recited in claim 1, wherein the initiation and discontinuation of the phase short circuits is suppressed when currents flowing in the phase terminals yield 0 A in total or are below a predefined threshold value.

15. A control device designed to control a multi-phase electric machine, operable at least in generator mode, whose phase terminals in an active bridge rectifier are respectively connected, via addressable first current valves capable of being switched on and shut off, to a first DC voltage terminal and via second current valves to a second DC voltage terminal, the control device designed to:

in a generator mode of the electric machine after occurrence of a load dump, repeatedly initiate and discontinue phase short circuits of the phase terminals via the first current valves, wherein a magnitude characterizing a natural frequency of the electric machine is ascertained, and the first current valves are addressed with a switching frequency to initiate and discontinue the phase short circuits on the basis of the magnitude characterizing the natural frequency of the electric machine.

16. A non-transitory machine-readable memory medium on which is stored a computer program for controlling a multi-phase electric machine, operable at least in generator mode, whose phase terminals in an active bridge rectifier are respectively connected, via addressable first current valves capable of being switched on and shut off, to a first DC voltage terminal and via second current valves to a second DC voltage terminal, the computer program, when executed by a control device, causing the control device to perform:

in a generator mode of the electric machine after occurrence of a load dump, repeatedly initiating and discontinuing phase short circuits of the phase terminals via the first current valves, wherein a magnitude characterizing a natural frequency of the electric machine is ascertained, and the first current valves are addressed with a switching frequency to initiate and discontinue the phase short circuits on the basis of the magnitude characterizing the natural frequency of the electric machine.

* * * * *